United States Patent
Senba et al.

(10) Patent No.: US 6,194,787 B1
(45) Date of Patent: Feb. 27, 2001

(54) MULTISTAGE COUPLING SEMICONDUCTOR CARRIER, SEMICONDUCTOR DEVICE USING THE SEMICONDUCTOR CARRIER

(75) Inventors: Naoji Senba; Kazuyuki Mikubo, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/833,159

(22) Filed: Apr. 4, 1997

(30) Foreign Application Priority Data

Apr. 4, 1996 (JP) .................................................. 8-082262

(51) Int. Cl.$^7$ .................................................. H01L 23/48
(52) U.S. Cl. .............................................. 257/786; 257/48
(58) Field of Search ............................... 257/48, 773, 786

(56) References Cited

U.S. PATENT DOCUMENTS 5,648,661 * 7/1997 Rostoker et al. ....................... 257/48

FOREIGN PATENT DOCUMENTS 63-318795   12/1988  (JP) .
  144040    9/1989  (JP) .

\* cited by examiner

*Primary Examiner*—Carl Whitehead, Jr.
*Assistant Examiner*—Roy Potter
(74) *Attorney, Agent, or Firm*—Sughrue, Mion, Zinn, Macpeak & Seas, PLLC

(57) ABSTRACT

The present invention adopts a circuit pattern in which in a carrier of a package for coupling semiconductor devices at multistage, drawing out lines for selecting individual semiconductor devices are coupled in parallel. Thus, the present invention achieves the multistage coupling semiconductor device which can be completed with a circuit pattern of one kind regardless of the number of stages of a multistage. Using the carrier having the foregoing structure, the semiconductor device is assembled and is subjected to characteristic inspections. Thereafter, the circuit patterns, coupled in parallel, having good electrical characteristics are partially cut by either laser, sand-blast, or etching. The products can be specified according to the circuit pattern which is cut.

8 Claims, 4 Drawing Sheets

MULTISTAGE COUPLING SEMICONDUCTOR CARRIER, SEMICONDUCTOR DEVICE USING THE SEMICONDUCTOR CARRIER

BACKGROUND OF THE INVENTION

1. Field of the Invention

The present invention relates to a carrier for a multistage coupling semiconductor, a semiconductor device using this carrier, and a manufacturing method of this semiconductor device.

2. Description of the Related Art

A semiconductor device coupled at four stages will be described as an example of a prior art. As shown in FIGS. 1(A) to 1(D), in case of a first stage E board 11, the E board 11 has a pattern that among chip selector pads b to e, only pad b is connected to a multistage connection pad 23 by a pattern 21 (see FIG. 1(A)). Similar to the first stage E board 11, in case of a second stage F board 12, the board has a pattern that among chip selector pad b to e, only pad c is connected by a pattern 21 (see FIG. 1(B)). Similar to the cases of the E and F boards, a third stage G board 13 has a pattern that a connection is made only for pad d (see FIG. 1(C)), and a fourth stage H board has a pattern that only a connection is made for pad e (see FIG. 1(D)). Specifically, in the prior art, carriers having different circuit patterns have been manufactured for the first to fourth substrates.

In the foregoing prior art, for example, in the case of the semiconductor device where four stages are coupled, the circuit patterns of the carriers of the boards have been different from first to fourth stages. For this reason, such a semiconductor device has drawbacks in that four kinds of pattern design, glass masks carriers, and electrical characteristic inspections are necessary for the four boards so that cost of the semiconductor device increases. Moreover, when non-defective percentages are different among the circuit patterns of the four boards, the yield percentage of the final product of the semiconductor device is restricted to the value of the lowest non-defective percentage. At the same time, the residual products including defective boards are treated as defective stocks. Moreover, managing cost increases because of variety of kinds of the circuit patterns.

SUMMARY OF THE INVENTION

An object of the present invention, which relates to a circuit pattern of a carrier for a multistage coupling semiconductor, is to provide a carrier for a multistage coupling semiconductor at a lower cost by reduction of the number of circuit patterns, facilitation of management and the like, a semiconductor device using this carrier, and a manufacturing method of this semiconductor device. Specifically, according to the present invention, there is provided a multistage coupling semiconductor carrier which comprises a board and drawing out lines for selecting more than one discrete semiconductor device; wherein the drawing out lines are coupled in parallel.

Namely, the present invention adopts a circuit pattern in which in a carrier of a package for coupling semiconductor devices at a multistage, drawing out lines for selecting individual semiconductor device are coupled in parallel. Thus, the present invention achieves a multistage coupling semiconductor device which can be completed with a circuit pattern of one kind regardless of the number of stages of a multistage.

In order to produce a semiconductor device, each multistage coupling semiconductor carrier having the drawing out lines coupled in parallel is fabricated as a semiconductor device, the drawing out line of the carrier regarded as a non-defective product of a good electrical characteristic after a characteristic inspection is partially cut to conduct multistage coupling. The cutting method is by either laser, sand-blast or etching.

Since a portion of a cut drawing out line of the carrier is not over coated with an insulating material, it can be cut precisely.

Further, since a drawing out line after partial cutting of a pattern of the carrier is coated with an insulating material such as resin, glass, alumina ceramics or the like, the cutting can be preserved.

Namely, according to the present invention, since a circuit pattern of one kind is formed regardless of the number of the multistages, management of one kind of the carrier, one kind of fabrication process and one kind of electrical characteristic inspection can be done easily, which gives the effect of much simplification of the manufacturing process and improvement of yield rate.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

Embodiments of the present invention will be described with reference to the accompanying drawings below.

First Embodiment

Figure 1A:
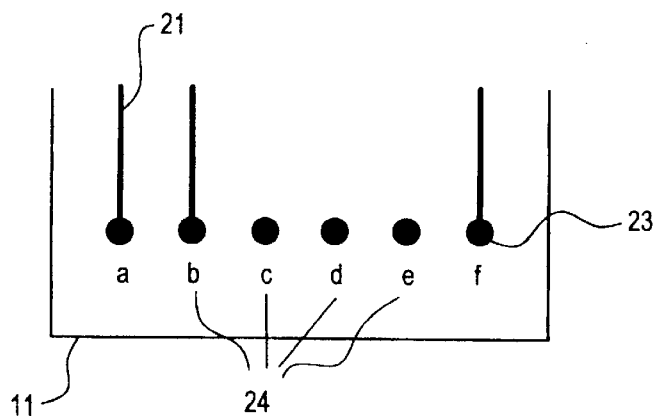
FIGS. 1(A) to 1(D) are plan views showing an embodiment of a prior art.
Figure 1B:
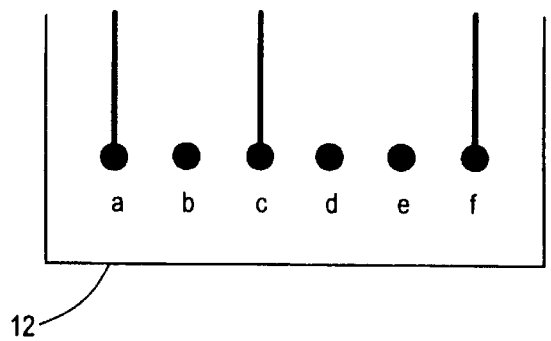
Figure 1C:
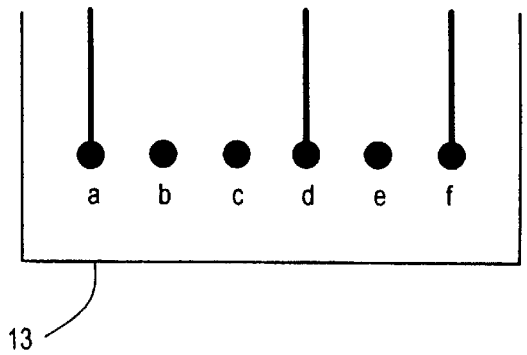
Figure 1D:
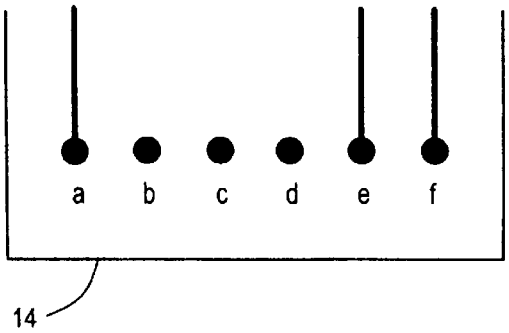
Figure 2A:
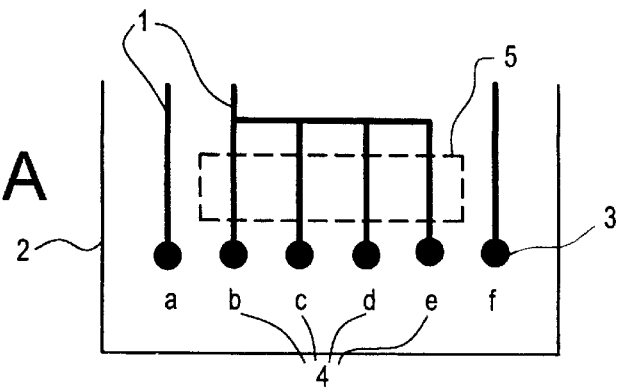
FIGS. 2(A) to 2(E) are plan views of an embodiment 1 of the present invention.

FIGS. 2(A) to 2(E) are plan views showing a first embodiment of the present invention. FIG. 2(A) is an example of a circuit pattern showing a carrier in the case of four stage coupling. Multistage coupling pads 3 are formed from a to f on a common board 2. Among these pads, b to e pads are used as the chip selector pad 4. The present invention has a feature in that b to e chip selector pads are connected in parallel by the pattern 1. In addition, after completion of an electric characteristic inspection, in order to specify the first to fourth stages, the desired pattern is cut. To facilitate cutting, a pattern cutting opening 5 is formed. It is possible to increase a cutting ability by this opening.

Figure 3:
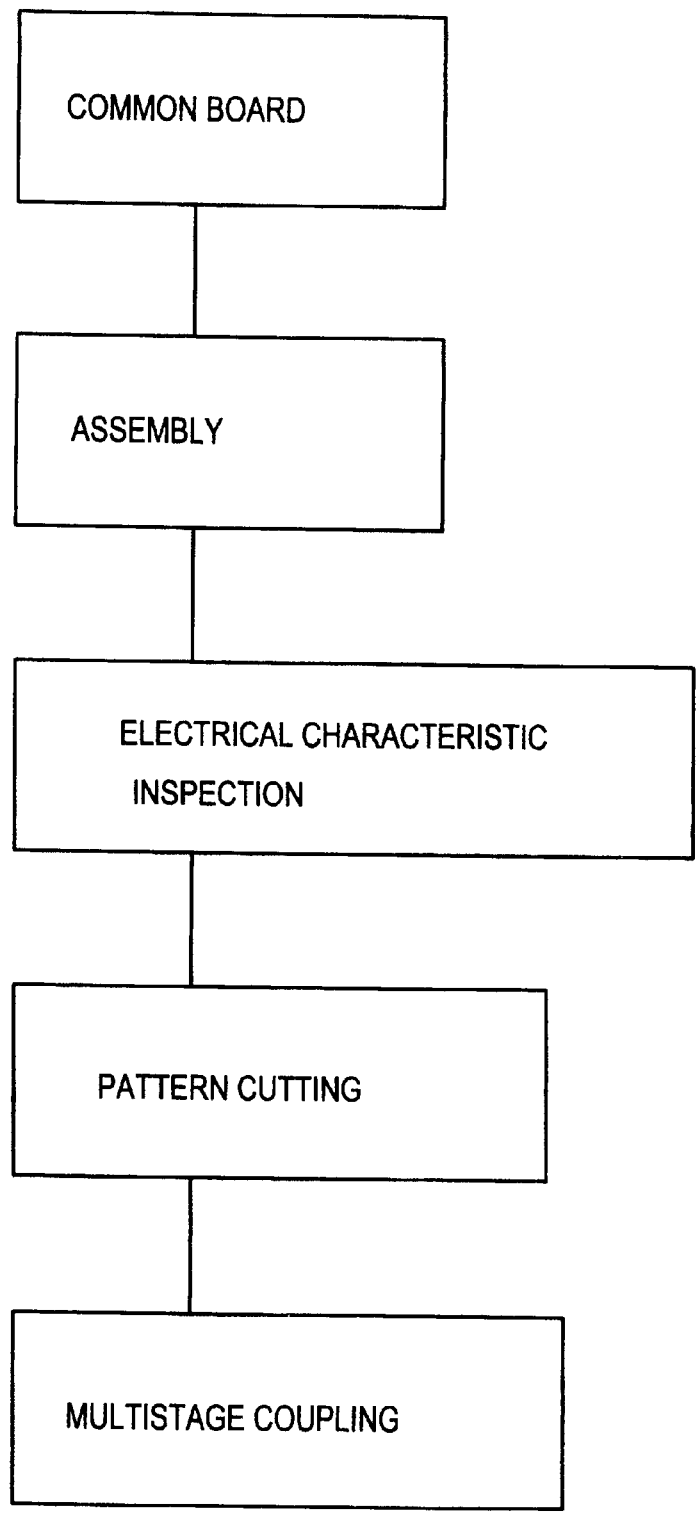
FIG. 3 is a flow chart of manufacturing steps of the present invention.

In this embodiment, the steps up to the assembly and the electric characteristic inspection are executed using the common board 2. Thereafter, only the non-defective products are chosen to form the desired pattern thereon by laser, sand-blast, etching and the like. Thus, the first to fourth stage boards are specified. FIG. 3 is a flowchart showing manufacturing steps of the present invention.

Figure 2B:
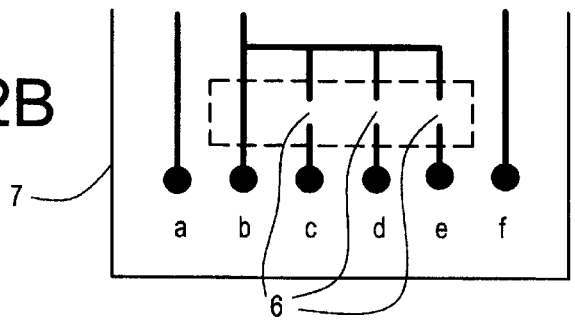
Figure 2C:
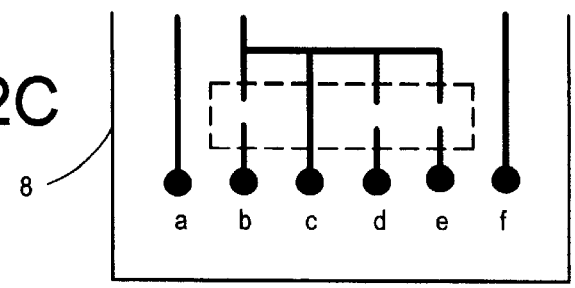
Figure 2D:
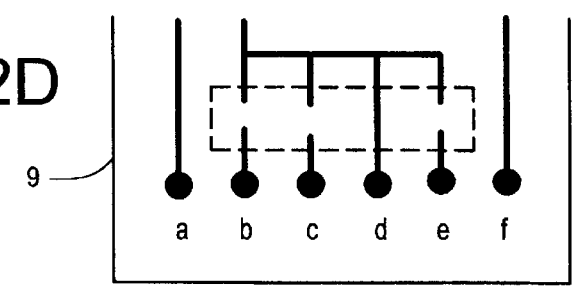
Figure 2E:
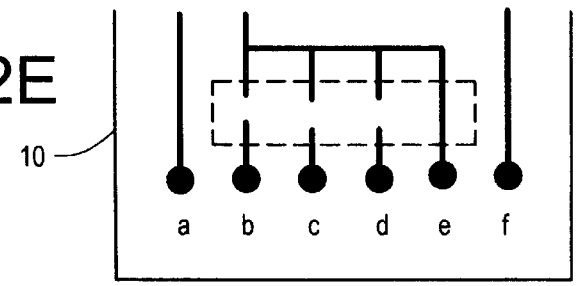

FIG. 2(B) shows a first stage A board 7. In case of a board 7 for the first stage A, the pattern 6 connected to c to e multistage connection pads 3 is cut. Similar to the board 7 for the first stage A, in case of the board 8 for the second board B, the pattern connected to b, d and e multistage connection pads is cut (see FIG. 2(C)), and in case of the board 9 for the third stage C, the pattern connected to b, c and e connection pads is cut (see FIG. 2(D)). Moreover, in case of the board 10 for the fourth stage D, the pattern connected to b to d pads is cut (see FIG. 2(E)).

Second Embodiment

Figure 4A:
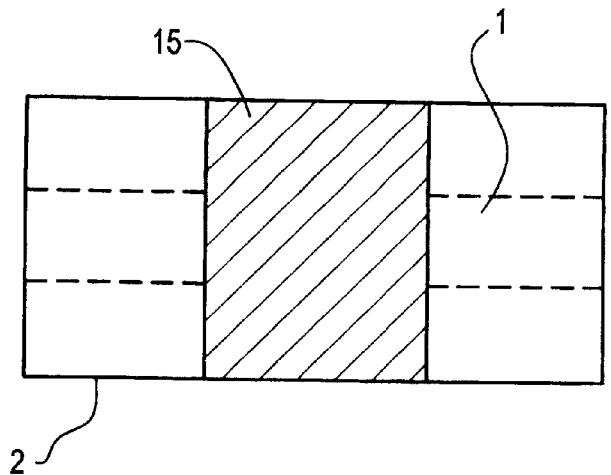
FIGS. 4(A) and 4(B) are a plan view and a sectional view showing an embodiment 2.
Figure 4B:
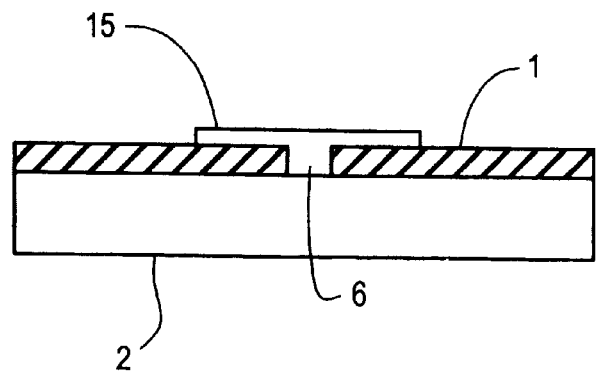

FIG. 4(A) is a plan view showing the cutting portion of the pattern coated with an insulating material. FIG. 4(B) shows a sectional view of FIG. 4(A). The pattern 1 formed in the board 2 is cut by laser, sand-blast, etching or the like. The cut pattern 6 is coated with an insulating material 15 such as resin, glass, alumina ceramics or the like. By adopting such structure, leakage and short defects owing to migration of the pattern material as well as defects owing to external factors such as humidity, contamination or the like can be prevented. Therefore, an increase in quality can be achieved and precise cutting can be preserved.

As described above, according to the present invention, since the circuit pattern of one kind is formed regardless of the number of the multistages, costs of design, management, materials and the like concerning the pattern formation are reduced. More-over, the present invention adopts the structure that the circuit patterns connected in parallel are partially cut as to only the non-defective products having sound electrical characteristic after the assembly and the electrical characteristic inspection, and the number of the steps is specified depending on the cut circuit pattern. Management during the manufacturing steps is made easy and the non-defective products can be effectively utilized regardless of the non-defective percentage of each stage. Thus, the stocks of the defective products in which some stages have defects are not produced as in the prior art.

Although the preferred embodiments of the present invention have been described in detail, it should be understood that various changes, substitutions and alterations can be made therein without departing from spirit and scope of the inventions as defined by the appended claims.

What is claimed is:

1. A multistage coupling semiconductor carrier for coupling with another multistage coupling semiconductor carrier, comprising a board for accepting one discrete semiconductor device, and having a plurality of multistage coupling pads formed thereon, said multistage coupling pads including at least one pad for electrical connection with said another multistage coupling semiconductor carrier, and a plurality of chip selector pads for electrical connection with said one discrete semiconductor device, and a circuit pattern formed on said board having a plurality of electrically conductive paths corresponding to said chip selector pads and respectively connected thereto;

wherein said electrically conductive paths are electrically connected to said one discrete semiconductor device in parallel.

2. The multistage coupling semiconductor carrier as set forth in claim 1, wherein said electrically conductive paths are cut at a predetermined portion to leave a selected one of said chip selector pads connected to said one discrete semiconductor device.

3. A multistage coupling semiconductor carrier for coupling with another multistage coupling semiconductor carrier, comprising:

a board for accepting one discrete semiconductor device, and having a plurality of multistage coupling pads formed thereon, said multistage coupling pads including at least one pad for electrical connection with said another multistage coupling semiconductor carrier, and a plurality of chip selector pads for electrical connection with said one discrete semiconductor device; and a circuit pattern formed on said board and having a plurality of electrically conductive paths corresponding to said chip selector pads and respectively connected thereto;

wherein said electrically conductive paths are initially connected electrically to said one discrete semiconductor device in parallel and then selectively cut to remove respective electrical connections between selected ones of said chip selector pads and said circuit pattern to allow a selective electrical connection to said one discrete semiconductor device.

4. The semiconductor device according to claim 3, wherein at least a portion of said circuit pattern after partial cutting is coated with an insulating material so as to cover cut ends of said selectively cut conductive paths.

5. A semiconductor device for coupling with another multistage coupling semiconductor carrier, comprising:

a board for accepting one discrete semiconductor device, and having a plurality of multistage coupling pads formed thereon, said multistage coupling pads including at least one pad for electrical connection with said another multistage coupling semiconductor carrier, and a plurality of chip selector pads for electrical connection with said one discrete semiconductor device; and a circuit pattern formed on said board and having a plurality of electrically conductive paths corresponding to said chip selector pads and respectively connected thereto;

wherein said electrically conductive paths are initially electrically connected to said one discrete semiconductor device in parallel and then selectively cut to remove respective electrical connections between selected ones of said chip selector pads and said circuit pattern to allow a selective electrical connection to said one discrete semiconductor device, said selective cutting being performed after said circuit pattern undergoes a characteristic inspection and is determined to be a non-defective product having good electrical characteristics.

6. A semiconductor device according to claim 5, wherein at least a portion of said circuit pattern after partial cutting is coated with an insulating material.

7. A multistage coupling semiconductor carrier for coupling with another multistage coupling semiconductor carrier, comprising:

a board for accepting one discrete semiconductor device, and having a plurality of multistage coupling pads formed thereon, said multistage coupling pads including at least one pad for electrical connection with said another multistage coupling semiconductor carrier, and a plurality of chip selector pads for electrical connection with said one discrete semiconductor device; and a circuit pattern formed on said board and having a plurality of electrically conductive paths corresponding to said chip selector pads and respectively connected thereto;

wherein said electrically conductive paths are connected to said one discrete semiconductor device in parallel and adapted to be cut so as to selectively connect to said one discrete semiconductor device.

8. A stacked multistage coupling semiconductor carrier package, comprising:

a first multistage coupling semiconductor carrier for coupling with a second multistage coupling semiconductor carrier, and wherein each of said first and second multistage coupling semiconductor carriers comprises:
 a board for accepting a respective one discrete semiconductor device, and having a plurality of multistage coupling pads formed thereon, said multistage coupling pads including at least one pad for electrical connection with the other of said first and second multistage coupling semiconductor carriers, and a plurality of chip selector pads for electrical connection with said respective one discrete semiconductor device, and a circuit pattern formed on said board having a plurality of electrically conductive paths corresponding to said chip selector pads and respectively connected thereto;
 wherein said electrically conductive paths are initially connected electrically to said respective one discrete semiconductor device in parallel and then selectively cut to remove respective electrical connections between selected ones of said chip selector pads and said circuit pattern to allow a selective electrical connection to said respective one discrete semiconductor device.

\* \* \* \* \*